United States Patent [19]

Geiger et al.

[11] Patent Number: 4,689,825

[45] Date of Patent: Aug. 25, 1987

[54] RECEIVER STAGE FOR RADIO OR TELEVISION RECEIVER

[75] Inventors: Erich Geiger, Unterkirnach; Gerhard Maier, Dauchingen, both of Fed. Rep. of Germany

[73] Assignee: Deutsche Thomson Brandt GmbH, Villingen, Fed. Rep. of Germany

[21] Appl. No.: 637,507

[22] Filed: Aug. 3, 1984

Related U.S. Application Data

[63] Continuation-in-part of Ser. No. 420,355, Sep. 17, 1982, abandoned.

[30] Foreign Application Priority Data

Aug. 26, 1981 [DE] Fed. Rep. of Germany ....... 3133760

[51] Int. Cl.$^4$ .............................................. H04B 1/08
[52] U.S. Cl. .................................... 455/347; 455/301; 455/183
[58] Field of Search ............... 455/183, 300, 301, 347, 455/348, 349; 358/254; 334/85

[56] References Cited

U.S. PATENT DOCUMENTS

| | | | |
|---|---|---|---|
| 3,723,882 | 3/1973 | Carlson | 455/349 |
| 3,783,420 | 1/1974 | Bastian | 455/349 |
| 3,980,951 | 9/1976 | Breeze et al. | 455/183 |
| 4,352,209 | 9/1982 | Ma | 455/301 |
| 4,353,132 | 10/1982 | Saitoh et al. | 455/301 |

Primary Examiner—Jin F. Ng
Attorney, Agent, or Firm—Horst M. Kasper

[57] ABSTRACT

A receiver stage for radio or television receiver. A single case enclosing a device comprises inside a tuner, an intermediate frequency amplifier connected to the tuner, a demodulator connected to the intermediate frequency amplifier, and a phase locked loop provision connected to the tunner. The joint case allows joint shielding of all components with shield plates mounted inside the case, avoids unreliable plug connections and reduces the production cost of radio and television receiver sets.

7 Claims, 2 Drawing Figures

RECEIVER STAGE FOR RADIO OR TELEVISION RECEIVER

CROSS-REFERENCE TO RELATED APPLICATIONS

This application is a continuation-in-part application of another application filed Sept. 17, 1982 and bearing Ser. No. 420,355 now abandoned. The entire disclosure of this latter application, including the drawings thereof, is hereby incorporated in this application as if fully set forth herein.

BACKGROUND OF THE INVENTION

1. Field of the Invention

The present invention relates to a receiver stage for a radio or a television receiver comprising a tuner, an intermediate frequency amplifier, a demodulator and a phase locked loop circuit.

2. Brief Description of the Background of the Invention Including Prior Art

Such receivers are provided with a tuner for selecting the different emitter frequencies of the radio and television station signals. These antenna signals fed to the tuner are transformed in the tuner by mixing with an oscillator frequency to an intermediate frequency. The intermediate frequency signals taken from the tuner are amplified in a following intermediate frequency amplifier. A demodulator following to the intermediate frequency amplifier demodulates the high frequency modulated signal to an audio frequency sound signal or respectively to a video frequency picture signal, which is fed to the final stages for reproduction in a loudspeaker or respectively on the screen of a television set. The individual electronic components such as tuner, intermediate frequency amplifier and demodulator have been conventionally disposed in separate component parts and were connected to each other via lines. These lines have to be shielded and are expensive for this reason. The required plug connections are susceptible to disturbances and form the sources of interferences, which can pass from the outside into the receiver station. Therefore, it has been taught to gather these named device units in a case. Thus there results an optimal shielding and the elimination of long connecting lines subject to the influence of disturbances (German Patent Laid Out DE-AS No. 1,958,993).

Receiver stations of more recent technology comprise capacitor diodes in the tuning circuits. The tuning voltage required for tuning is generated in this case with the aid of a phase locked loop circuit. This phase locked loop circuit provides a D.C. voltage, which results depending on a preselectable divider ratio of a frequency divider of the phase locked loop circuit. The phase locked loop circuit serving tuning purposes is disposed in a separate device component part. This arrangement with separation from the tuner unit however again results in the disadvantage, that interfering pulses can pass to the lines for the data input of the phase locked loop circuit as well as to the tuning voltage carrying line to the tuner unit, which can interfere with the tuning.

SUMMARY OF THE INVENTION

1. Purposes of the Invention

It is an object of the present invention to eliminate a possibility of disturbances from radio or television receiver apparatus.

It is another object of the present invention to provide a compact device comprising major elements employed in tuning of a radio or television receiver.

It is a further object of the invention to simplify the assembly and servicing of radio and television sets.

These and other objects and advantages of the present invention will become evident from the description which follows.

2. Brief Description of the Invention

The present invention provides a receiver stage for a radio or a television receiver wherein a single case encloses a device which comprises a tuner, an intermediate frequency amplifier connected to the tuner, a demodulator connected to the intermediate frequency amplifier, and a phase locked loop provision connected to the tuner.

The phase locked loop can comprise a reference source, a phase detector connected to the reference source, a low pass filter connected to the output of the phase detector and to the tuner, and a programmable divider having its output connected to the phase detector and having an input connected to the tuner. The phase locked loop can comprise a shift register having an output connected to the programmable predivider. The tuner can comprise an oscillator, a preamplifier and a mixer stage connected to the preamplifier and to the oscillator and having its output connected to the intermediate frequency amplifier. The tuner can comprise a band switch having inputs connected to the shift register and having outputs connected to the preamplifier and to the oscillator.

The case can be comprised of metal and/or plastic as a structural element. The connecting leads between the phase locked amplifier and the tuner can be not more than 5 centimeters and are preferably less than 2 centimeters.

A shielding metal plate can be disposed between the tuner section and the phase locked loop provision area and between the phase locked loop provision area and the intermediate frequency amplifier and automatic gain control area. In addition, a separating shielding metal plate can be disposed between an antenna input filter section and the tuner. Furthermore, a metal shielding plate can be disposed between an UHF area and a VHF area of the tuner, where this plate is attached to the plate separating the antenna input filter section from the tuner and to the metal plate separating the tuner and the phase locked loop provision area.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing in which is shown one of the various possible embodiments of the present invention.

DESCRIPTION OF INVENTION AND PREFERRED EMBODIMENTS

Figure 1:
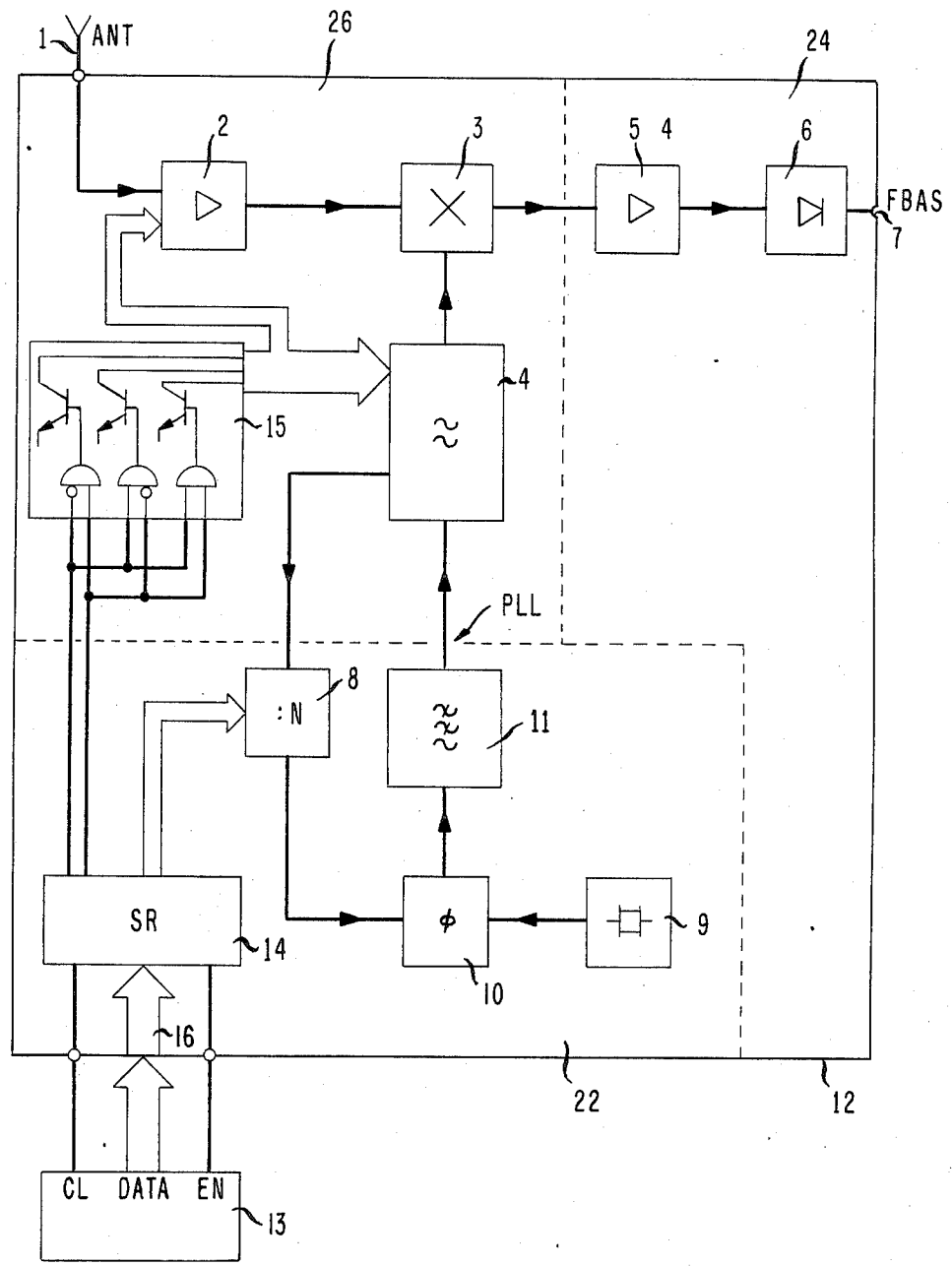
FIG. 1 is a view of a schematic diagram showing the construction according to the invention.

In accordance with the present invention there is provided a receiver stage for radio and television receivers with a tuner and an intermediate frequency amplifier, with a demodulator following to the intermediate frequency amplifier as well as a phase locked loop circuit for tuning of tuning circuits provided with capacitance diodes. The receiver circuits, intermediate frequency stages and the demodulator are disposed in a case jointly forming a device, which is characterized in that the phase locked loop circuit is disposed in this case.

The signals received by the antenna 1 are amplified in a conventional way in a preamplifier 2. The preamplifier is disposed in the tuner area 26 of the receiver. The output of the preamplifier 2 together with the frequency obtained from an oscillator is mixed to an intermediate frequency in the mixing stage 3. The oscillations are amplified in the intermediate amplifier 5 and are demodulated with the aid of the demodulator 6 and the output signal FBAS of the demodulator 6 can be picked up at the connection 7. The components intermediate amplifier 5 and demodulator 6 form part of an intermediate amplifier and automatic gain control section 24. The recited stages are provided in a case and in a single shielding container possibly of the kind described in the German Patent Laid Out DE-AS No. 1,958,993.

In accordance with the teaching of the invention the device components for the phase locked loop (PLL) circuit 22 including programmable predivider 8, reference source 9, phase detector stage 10 and low pass filter 1 are integrated in the same case 12 for generating the tuning voltage. The reference source can be provided by a voltage controlled or by a current controlled oscillator. The output of the input unit 13 is connected to a shift register 14. The shift register 14 is connected to the band switch 15 and to the predivider 8. The data determined for the selected channel can be entered via an input unit 13 connected from the outside to the case 12. These data can set the predivider 8 as well as the bandswitch 15. After the input of the data via the data line 16 as well as via the clock input C1 and the enable input EN these can be disconnected such that also disturbing pulses cannot any longer influence the phase locked loop circuit. The elementary devices employed in the circuits of the present invention are preferably provided by large scale integrated circuits or very large scale integrated circuits. The case for the composite device can be constructed in a similar way as the case taught in German Patent Laid Out DE-AS No. 1,958,993. The leads between the phase locked loop and the tuning circuit can be quite small, that is less than about 5 centimeters and preferably less than about 2 centimeters.

Figure 2:
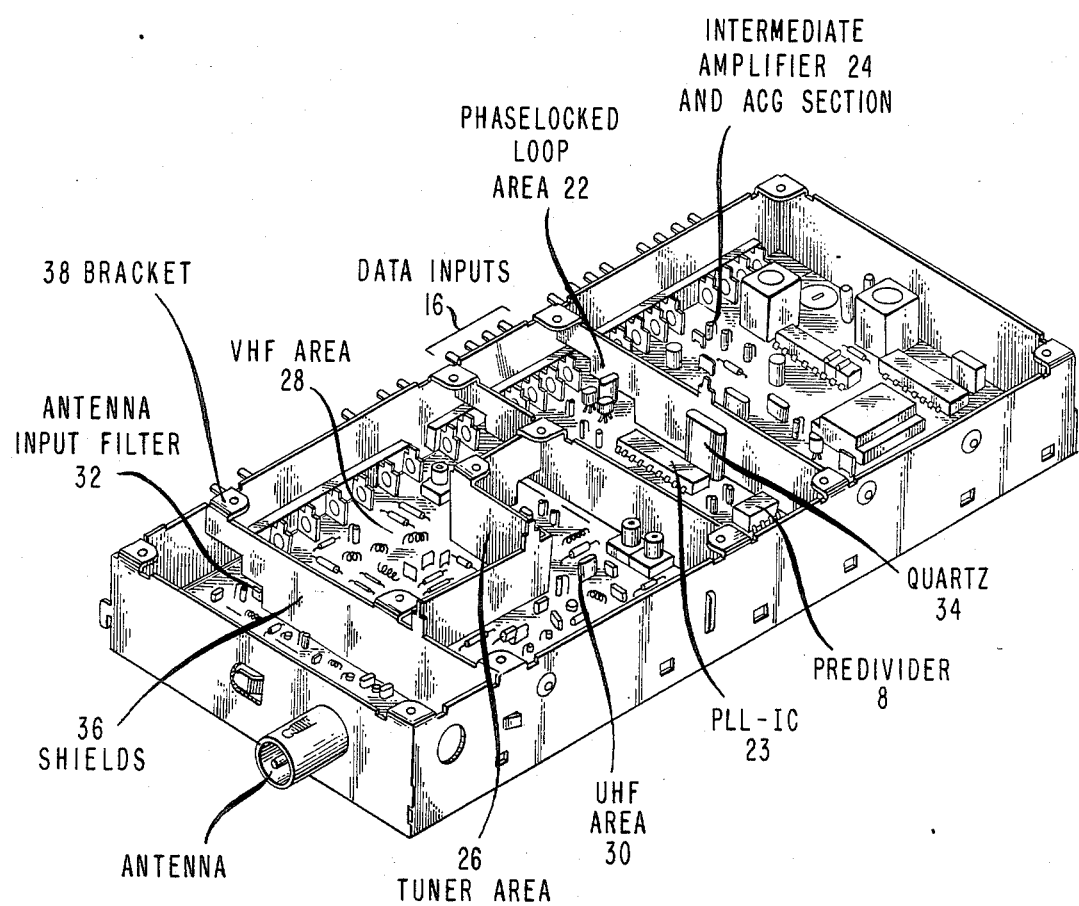
FIG. 2 is a perspective view of the construction according to the invention.

FIG. 2 shows in more detail and in perspective the disposition of the individual components. The tune area 26, the phase locked loop provision area 22 and the intermediate amplifier and automatic gain control section 24 are disposed about sequentially in a single case having respective subdivided areas 26, 22 and 24. The antenna input 1 enters a section containing an antenna input filter as a first subdivided area. The signal is fed to a respective subdivided tuning section for the UHF area 30 and for the VHF area 28. These areas 28 and 38 are disposed more or less in parallel running from the antenna input filter section. The areas 28 and 30 are followed by a phase locked loop area 22, which contains a phase locked loop integrated circuit 23, a predivider 8 and a quartz oscillator 34. Data inputs 16 are connected from the outside of the box case 12 to the phase locked loop provision area 22. An output of the phase locked loop provision area 22 is fed to the adjoining intermediate amplifier and automatic gain control section 24. The disposition of the antenna input filter area 32, followed by parallel tuner sections 28,30, followed in turn by a phase looked loop area 22 and again followed by and intermediate amplifier and automatic gain control section 24 provides an advantageous arrangement, which does not require the production of separate enclosed components and allows the use of a single case. This construction is space saving as a handling area would otherwise be required for the casing of each component. The inventor provides that the various areas are separated by subdividing electromagnetic shields 36. The subdividing electromagnetic shields 36 can be provided with brackets 38 for attaching a cover plate of for being mounted in the case.

The invention provides advantages by way of the construction layout. By the elimination of a separate PLLunit, the tuner receiver part can form a compact unit from the antenna input to the demodulator output including the electronic components required for the tuning and the band switching.

It will be understood that each of the elements described above, or two or more together, may also find a useful application in other types of receiver station system configurations and received signal processing procedures differing from the types described above.

While the invention has been illustrated and described as embodied in the context of a receiver for a radio or a television receiver, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A single case having first, second side walls and first, second end walls for housing the circuitry of a radio or television receiver comprising a tuner section wherein the tuner section comprises a VHF section and a UHF section which are disposed about in parallel between said first and second side walls and between an antenna input filter section and a phase locked loop section, data inputs mounted on said first side wall of the case near the phase locked loop section, the VHF section being located next to the first side wall of the case with the data inputs;

the phase locked loop section being connected to the tuner section and separated from the tuner section by a first subdivision metal shielding plate;

the antenna input filter section located between an antenna input end on the first end wall of the case and the tuner section;

a second subdividing metal shielding plate for separating the tuner section from the antenna input filter section;

a third subdividing metal shielding plate attached to the first and second subdividing metal shielding plates for providing a separation between the UHF section and the VHF section;

an intermediate frequency amplifier connected to the tuner section and located between the phase locked loop section and the second end wall of the case and separated from the phase locked loop section by a fourth subdividing metal shielding plate, the first, second, third and fourth subdividing shielding plates each comprising brackets at the top for attaching a cover plate; and, a demodulator connected to the intermediate frequency amplifier.

2. The single case for housing the circuits of a radio or a television receiver according to claim 1 wherein the phase locked loop section comprises a quartz oscillator reference source;

a phase detector connected to the reference source;

a low pass filter connected to the output of the phase detector and to the tuner section;

a programmable predivider having its output connected to the phase detector and having an input connected to the tuner section;

a shift register having an output connected to the tuner and having an output connected to the programmable predivider, wherein the phase locked loop section is disposed near the middle of the case where data inputs are disposed on the case next to the phase locked loop section.

3. The single case for housing the circuits of a radio or a television receiver according to claim 2 wherein the tuner section comprises an oscillator;

a preamplifier; and a mixer stage connected to the preamplifier and to the oscillator and having its output connected to the intermeidate frequency amplifier; and a band switch having inputs connected to the shift register and having outputs connected to the preamplifier and to the oscillator.

4. The single case for housing the circuits of a radio or a television receiver according to claim 1 wherein the case comprises metal as a structural element.

5. The single case for housing the circuits of a radio or a television receiver according to claim 1 wherein the case comprises plastic as a structural element.

6. The single case for housing the circuits of a radio or a television receiver according to claim 1 wherein leads between the circuits of the phase locked loop section and a tuner circuit section are at most 5 centimeters.

7. The single case for housing the circuits of a radio or a television receiver according to claim 1 wherein the leads between the circuits of the phase locked loop section and the tuner circuit section are at most 2 centimeters.

* * * * *